United States Patent
Haah et al.

(10) Patent No.: US 11,437,995 B1
(45) Date of Patent: Sep. 6, 2022

(54) JOINT LOGICAL MEASUREMENTS ON DIAGONAL PATCHES OF SURFACE CODE

(71) Applicant: Microsoft Technology Licensing, LLC, Redmond, WA (US)

(72) Inventors: Jeongwan Haah, Bellevue, WA (US); Michael Beverland, Seattle, WA (US); Nicolas Guillaume Delfosse, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/187,106

(22) Filed: Feb. 26, 2021

(51) Int. Cl.
  *G06N 10/00* (2022.01)
  *H03K 19/003* (2006.01)
  *H03K 19/195* (2006.01)

(52) U.S. Cl.
  CPC .......... *H03K 19/003* (2013.01); *G06N 10/00* (2019.01); *H03K 19/195* (2013.01)

(58) Field of Classification Search
  CPC ..... G06N 10/00; H03K 19/003; H03K 19/195
  See application file for complete search history.

(56) References Cited

U.S. PATENT DOCUMENTS

| | | | |
|---|---|---|---|
| 2018/0032894 A1* | 2/2018 | Epstein | G06N 10/00 |
| 2018/0052806 A1* | 2/2018 | Hastings | G06N 10/00 |
| 2018/0232649 A1* | 8/2018 | Wiebe | G06N 10/00 |
| 2020/0116784 A1* | 4/2020 | Liu | G06N 10/00 |
| 2021/0272000 A1* | 9/2021 | van den Berg | G06F 7/723 |
| 2021/0287125 A1* | 9/2021 | Maslov | G06F 17/16 |

FOREIGN PATENT DOCUMENTS

CA  3094740 A1  2/2020

OTHER PUBLICATIONS

Bravyi, Sergey, "Fault-Tolerant Quantum Computing by Code Deformation", In Journal of QIP Tutorial, 2016, 80 Pages.
Calderbank, et al., "Good Quantum Error-Correcting Codes Exist", In Journal of Physical Review A, vol. 54, Issue 2, Aug. 1996, pp. 1098-1105.
Fowler, et al., "Low Overhead Quantum Computation using Lattice Surgery", In Repository of arXiv:1808.06709v1, Aug. 20, 2018, pp. 1-15.
Fowler, et al., "Surface Code Quantum Error Correction Incorporating Accurate Error Propagation", In Repository of arXiv:1004.0255v1, Apr. 1, 2010, 7 Pages.
Haah, et al., "Codes and Protocols for Distilling T, controlled-S, and Toffoli Gates", In Journal of Quantum, vol. 2, Jun. 7, 2018, 29 Pages.

(Continued)

*Primary Examiner* — Kurtis R Bahr
(74) *Attorney, Agent, or Firm* — Holzer Patel Drennan

(57) ABSTRACT

A quantum computing system implementing surface code in a measurement circuit may be configured to translate a quantum algorithm including at least one Hadamard gate into an equivalent circuit that lacks a Hadamard gate, the circuit including Hadamard-conjugated Pauli measurements that include joint logical measurements implemented on diagonally-arranged patches of the surface code.

17 Claims, 8 Drawing Sheets

(56) References Cited

OTHER PUBLICATIONS

Karzig, et al., "Scalable Designs for Quasiparticle-Poisoning-Protected Topological Quantum Computation with Majorana Zero Modes", In Journal of Physical Review B, vol. 95, Issue 23, Jun. 21, 2017, 32 pages.

Litinski, Daniel, "A Game of Surface Codes: Large-Scale Quantum Computing with Lattice Surgery", In Journal of Quantum, vol. 3, Mar. 5, 2019, 37 Pages.

Litinski, et al., "Lattice Surgery with a Twist: Simplifying Clifford Gates of Surface Codes", In Journal of Quantum, vol. 2, May 4, 2018, 16 Pages.

Lao, et al., "Mapping of Lattice Surgery-Based Quantum Circuits on Surface Code Architectures", In Repository of arXiv:1805.11127v1, May 28, 2018, 15 Pages.

"International Search Report and Written Opinion Issued in PCT Application No. PCT/US2022/017390", dated Jun. 28, 2022, 14 Pages.

\* cited by examiner

JOINT LOGICAL MEASUREMENTS ON DIAGONAL PATCHES OF SURFACE CODE

BACKGROUND

To realize practical implementation of quantum devices, it is critical to be able to compile high-level quantum algorithms into lower-level fault tolerant circuits. Constraints of a fault-tolerant quantum computing system require that the system provide an available set of quantum gates that form a discrete universal gate set.

A number of useful fault-tolerant quantum basis sets arise from augmenting the set of Clifford gates by one or more unitary gates in order to make the gate set universal. Such a gate set is said to be universal if it generates a group of gates that provides a dense coverage over all unitaries. Examples comprise the Clifford+T basis, consisting of the two-qubit controlled-Not gate (CNOT) and the single-qubit Hadamard gate (H) as generators for the Clifford gates, along with the T gate, implementing a relative phase of $e^{i\pi/4}$, the Clifford-$\pi/12$ basis, consisting of CNOT and H gates along with a single qubit-unitary that implements a relative phase of $e^{\pi/12}$, and the Clifford+V basis, consisting of the CNOT and H gates, along with 6 gates that are defined over the cylotomic integers Z[i]. Efficient algorithms for approximating a single qubit gate into each of the universal gate sets Clifford+T and Clifford+V are available in the art.

Different quantum architectures may, in practice, be capable of implementing different gate sets, with most architectures are unable to implement at least one or more Clifford gates. However, it is known that the implementation of any Clifford operation can be achieved by measuring an arbitrary tensor product of Pauli matrices. Therefore, even if a given quantum architecture does not make all Clifford gates directly available, the complete set of Clifford operations may still be effectively implemented via sequences of Pauli measurements. Having a complete set of Pauli measurements available in a given quantum architecture is therefore equivalent to having a complete set of Clifford operations.

Currently, surface code is one of the most popular quantum error correction schemes for fault-tolerant computing. Surface code tolerates high error rates and is easy to implement on a grid of qubits using only logical gates. However, current applications of the surface code do not provide a capability to make certain types of Pauli measurements. Specifically, surface code applications do not currently support a set of Pauli measurement requisite to implement the Hadamard gate.

SUMMARY

According to one implementation, a quantum computing system includes a classical controller configured to translate a Hadamard operation within a quantum algorithm into executable instructions that include performing a joint logical measurement on two diagonally-arranged patches of surface code. The quantum computing system includes a measurement circuit that implements the surface code and that is controlled by the classical controller to perform the joint logical measurement on the two diagonally-arranged patches of surface code.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other implementations are also described and recited herein.

DETAILED DESCRIPTION

Figure 1:
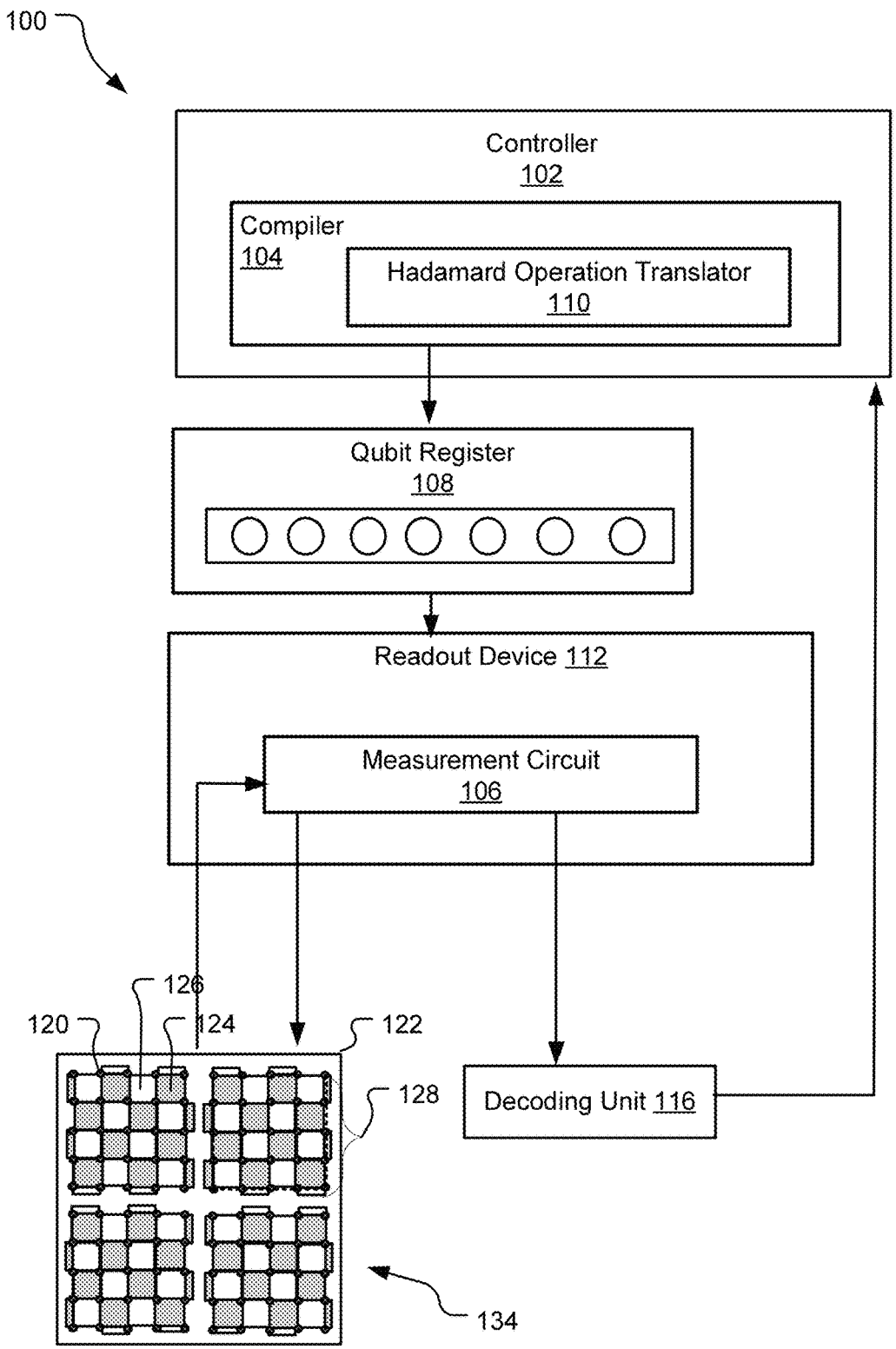
FIG. 1 illustrates a quantum computing system that includes a measurement circuit implementing a surface code architecture that supports Hadamard operations using circuit equivalents that include Hadamard-conjugated Pauli measurements implemented as joint measurements on diagonal patches of surface code.

The herein disclosed technology provides an application of surface code that supports joint logical measurements usable to effectively replace Hadamard operations with sets of equivalent Pauli measurements that can be executed within a quantum measurement circuit implementing surface code.

In one implementation, the disclosed solutions are used to support the Clifford+T architecture where T gates are distilled and teleported and Clifford operations can be generated by various applications of the CNOT gate, H gate, and S gate. The S gate may be implemented in a variety of ways, the teachings of which are considered external to the scope of this disclosure. However, it is presumed that the S gate can be implemented by surface code architecture disclosed herein. In this disclosed architecture, the CNOT gate is implemented by measuring XX and ZZ using an ancilla qubit in combination with Pauli frame tracking (a known mechanism useful to relax the timing constraints for error syndrome measurement and error decoding).

Each instance of the Hadamard gate can be commuted through the circuit and the net effect is to interchange the logical qubit measurements $\overline{XX}$ with $\overline{ZX}$, $\overline{ZZ}$ with $\overline{XZ}$ and $\overline{X}$ with $\overline{Z}$. As background, it is noted that a measurement of the tensor product $\overline{XZX}$ (the tensor product of X, Z, X, acting on the logical qubits) is equivalent to measuring $H_2$ $(\overline{XXX})H_2$ acting on the logical qubits, where $H_2$ is the Hadamard gate. Using this relation, it can be seen that a logical qubit measurement in the ZX basis ($M_{z \otimes x}$) is equivalent ($M_{x \otimes x} H |\psi\rangle$), a logical qubit measurement performed in the XX basis after applying Hadamard. Hence, it suffices to remove all occurrences of the Hadamard gate in any Clifford circuit and to replace these occurrences with Hadamard-conjugated Pauli equivalents that rely on the logical qubit measurements of $\overline{ZX}$ and $\overline{XZ}$.

As mentioned above, traditional applications of the surface code do not offer a mechanism to measure $\overline{ZX}$ or $\overline{XZ}$ across two logical patches of the surface code. AS used herein, the term "logical patch" refers to a patch of surface code that is utilized to store a single logical qubit with the data of the logical qubit being spread out over multiple data qubits within the logical patch.

The herein disclosed technology proposes a modified architecture for the surface code and a specific set of operations that allow the proposed architecture to support joint logical measurements across two diagonally-arranged logical surface code patches, thereby enabling replacement of Hadamard gates with sets of Pauli measurement equivalents. As used herein "joint logical measurement" refers to a joint measurement of two patches of surface code. When diagonal patches are employed as disclosed herein, this measurement is either logical $\overline{ZX}$ or logical $\overline{XZ}$.

FIG. 1 illustrates a quantum computing system 100 that includes a measurement circuit 106 implementing a surface code architecture that supports Hadamard operations using equivalent sets of Pauli measurements that can be implemented as joint measurements on diagonal patches of surface code. According to one implementation, the measurement circuit 106 implements logic for effecting $\overline{ZX}$ and $\overline{XZ}$ measurements (exemplary Hadamard-conjugated Pauli equivalents) across diagonally-adjacent logical patches of the surface code. The quantum computing system 100 includes a classical controller 102 that includes a compiler 104 that compiles a quantum algorithm into a quantum circuit. In one implementation, the quantum algorithm(s) implemented are in the Clifford+T basis. The compiler 104 includes a Hadamard translator 110 that translates each instance of a Hadamard operation within the quantum algorithm into an equivalent set of Hadamard-conjugated Pauli measurements that are executed by manipulating qubits within a qubit register 108.

Values of the qubits resulting from such manipulations are read by a read-out device 114 using a measurement circuit 106, which may be each understood as including hardware, such as one or more quantum and/or classical processors and/or classically-implemented software. Hardware components of the measurement circuit 106 are designed to execute sequences of quantum operations on the physical qubits in the qubit register 108 while software components of the measurement circuit 106 are designed to classically manipulate measured qubit values.

The measurement circuit 106 implements surface code. By example and without implementation, the surface code considered in the applications described below is a 45 degree rotated version of the standard toric code with certain boundary conditions. A view 134 illustrates an example portion of the measurement circuit 106 represented by a surface code graph 122. The surface code graph 122 includes a checkerboard pattern of plaquettes (e.g., a plaquette 124) with corners (nodes) corresponding to qubits in the measurement circuit 106 and edges corresponding to physical connections between qubit locations.

As shown in the surface code graph 122, the measurement circuit 106 encodes a combination of data qubits, represented by filled circles (e.g., a data qubit 120) arranged at the corners of plaquettes. Each plaquette represents a stabilizer measurement that may be performed on the associated data qubits forming the corners of that plaquette. Stabilizers are widely known and used in quantum computations. The stabilizer measurement is used to determine a parity of the associated data qubits without direct measurement of their qubit states, which would destroy the corresponding data. In one implementation, an ancilla qubit (not shown) is positioned at the center of each plaquette. In this architecture, the stabilizer measurement entails entangling the four corner data qubits with the stabilizer via a sequence of CNOT operations, followed by a measurement of the ancilla qubit in the Z or X basis. In other implementations, stabilizer measurements are realized via other known mechanisms without the use of ancilla qubits.

In the illustrated implementation, a shaded plaquette (e.g., shaded plaquette 124) means that there is a stabilizer which is a tensor product of Z over the vertices (data qubits) of the plaquette. In contrast, an unshaded plaquette (e.g., unshaded plaquette 126) means the same, but for X. The illustrated portion of the surface code graph 122 includes four different "patches" of surface code (e.g., a patch 128), each patch having a depth (d) (wherein d=5 in the example) and encoding one logical qubit (such that four logical qubits are encoded on the four surface code patches shown.

As background, the following sets forth some basic logical operations of the surface code. Following this section is a proposed extension of the background principles that facilitates, for the first time, a logical $\overline{ZX}$ and $\overline{XZ}$ measurement using the proposed surface code architecture. In one implementation, logical Hadamard operations are realized on the individual patches of surface code by performing these logical $\overline{ZX}$ and $\overline{XZ}$ measurements (Hadamard-conjugated Pauli measurements) across diagonally-adjacent pairs of surface code patches. Processed outcome data output by the measurement circuit 106 is provided to a decoder unit 116 which, in turn identifies fault locations. Error correction is then performed by the classical controller 102 using one or more suitable error correction code algorithms.

Exemplary Logical Operations Using Surface Code

A. Pauli Logical Operators

Every logical operation that is considered in the proposed surface code architecture is some measurement of a single-patch or multi-patch Pauli logical operator. Hence, the only effect of logical Pauli operator is to reinterpret the measurement readout. The classical controller 102 therefore keeps track of two bits for every logical qubit (e.g., every surface code patch). These two tracked bits record the parity of the logical X and Z Pauli operators which have been applied to the patch.

B. Measurement of $\overline{X}$ and $\overline{Z}$

Figure 2A:
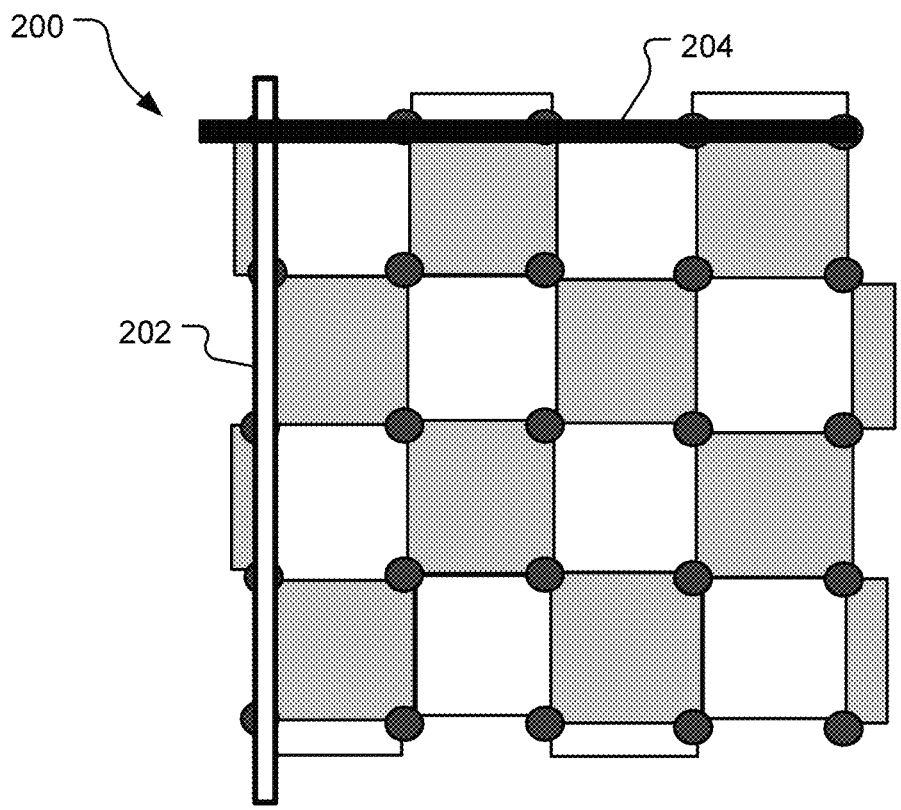
FIG. 2A illustrates an individual surface code patch indicating horizontally-arranged and vertically-arranged qubits usable to compute a logical $\overline{X}$ or a logical $\overline{Z}$ operator of the surface code patch.

Since the surface code is a CSS code, the X and Z logical operators ($\overline{X}$ and $\overline{Z}$) of each individual patch can be measured by measuring individual qubits in the corresponding basis. FIG. 2A illustrates an individual surface code patch 200 indicating horizontally-arranged and vertically-arranged qubits usable to compute a logical $\overline{X}$ or a logical $\overline{Z}$ operator of the surface code patch 200. The product of Z-basis measurements along any column (e.g., a column 202) of the data qubits is a logical operator Z, while the product of X along any row of qubits (e.g., a row 204) is a logical operator $\overline{X}$. Notably, the measurement of these data qubits destroys the code.

Any measurement readout error on an individual qubit can be regarded as some single-qubit error followed by perfect readout, and these single-qubit errors can be located and by a decoder which returns a fault-tolerant outcome, so there is need to repeat the single-qubit measurements provided. Note that this prescription does not work for the measurement of $\overline{Y}$.

C. Initialization of the Code in an Eigenstate of $\overline{X}$ or $\overline{Z}$.

Since the surface code is a CSS code, an eigenstate of $\overline{X}$ can be initialized for a logical patch of surface code by entangling the data qubits bounding each of the shaded plaquettes (also referred to herein as "measure-X plaquettes"). Then, a stabilizer measurement can be performed on each shaded plaquette. The latter is identical to the usual syndrome extraction operation. At the initial round of syndrome extraction, independent Z-stabilizers have completely random outcomes, even in the absence of noise. After sufficiently many rounds of syndrome extraction (d rounds suffice under a stochastic independent noise model), the location of errors are determined by a decoder which is used to update the Pauli frame of the individual qubits of the code. Since the initial state (in the absence of error) is an eigenstate of $\overline{X}$, the final state is a fault-tolerant eigenstate of $\overline{X}$. The fact that Z-stabilizers were random initially bears no effect because any X-correction commutes with $\overline{X}$. The procedure is analogous for initializing an eigenstate of $\overline{Z}$.

D. Horizontal $\overline{ZZ}$ and Vertical $\overline{XX}$ Measurements.

Figure 2B:
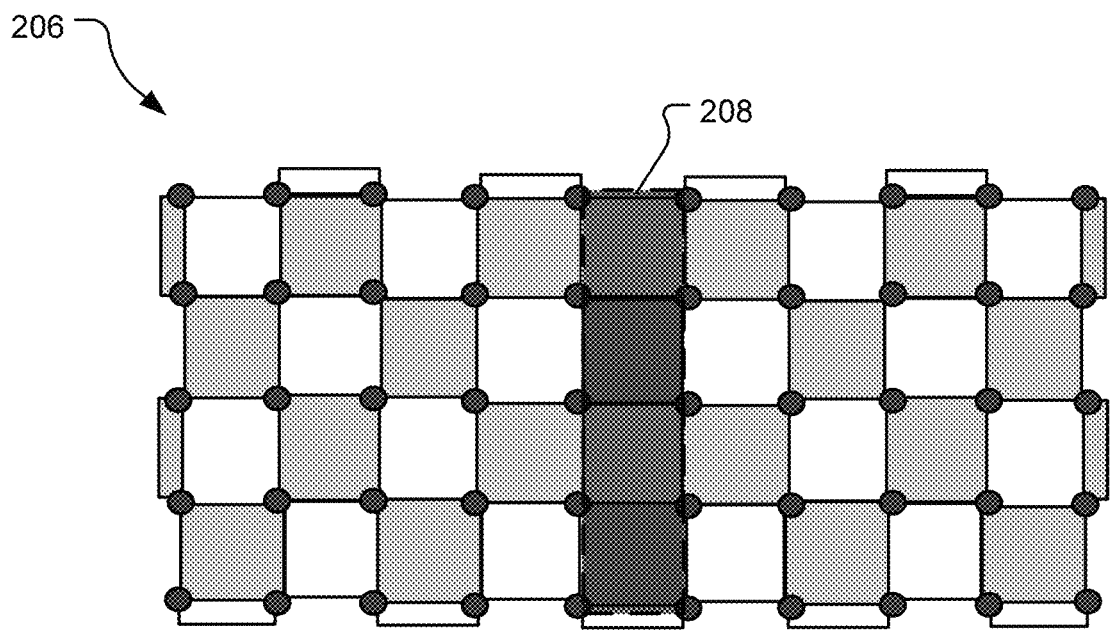
FIG. 2B illustrates horizontally-arranged surface code patches usable to implement a horizontal $\overline{ZZ}$ measurement on a pair logical qubits.

FIG. 2B illustrates horizontally-arranged surface code patches 206 usable to implement a horizontal $\overline{ZZ}$ measurement on a pair of logical qubits. On vertically-arranged patches (not shown), $\overline{XX}$ may be similarly measured.

In the surface code layout depicted, the logical operators of a given type are parallel in any pair of horizontally-neighboring patches. For example, note that the patch on the right hand side is the mirror image of the patch on the left. A technique known as "lattice surgery" is employed to measure $\overline{ZZ}$. This entails measuring the X- and Z-stabilizers that are in a group 208 between the two patches. The individual new Z-stabilizers have random outcomes, but the parity of the Z-stabilizers, without noise, is the measurement outcome of $\overline{ZZ}$ (in the absence of error). To have a fault-tolerant outcome, the measurement of all stabilizers is repeated, including the group 208. Under the stochastic independent noise model, d rounds suffice. Once the outcome is determined, we stop measuring the stabilizers in the group 208, and resume the usual syndrome extraction for each patch. The $\overline{XX}$ measurement for vertically neighboring patches is analogous.

E. Teleportation.

Teleportation between vertically neighboring patches is achieved by initializing the target patch in $\pm_t$, measuring $\overline{Z}_s\overline{Z}_t$ across the source and the target patches, and measuring $\overline{X}_s$ of the source patch, with the teleportation being complemented by appropriate Pauli frame update. Teleportation between horizontally neighboring patches is achieved analogously by initializing the target patch in $\overline{0}_t$, measuring $\overline{X}_s\overline{X}_t$, and then measuring $\overline{Z}_s$.

Figure 3:
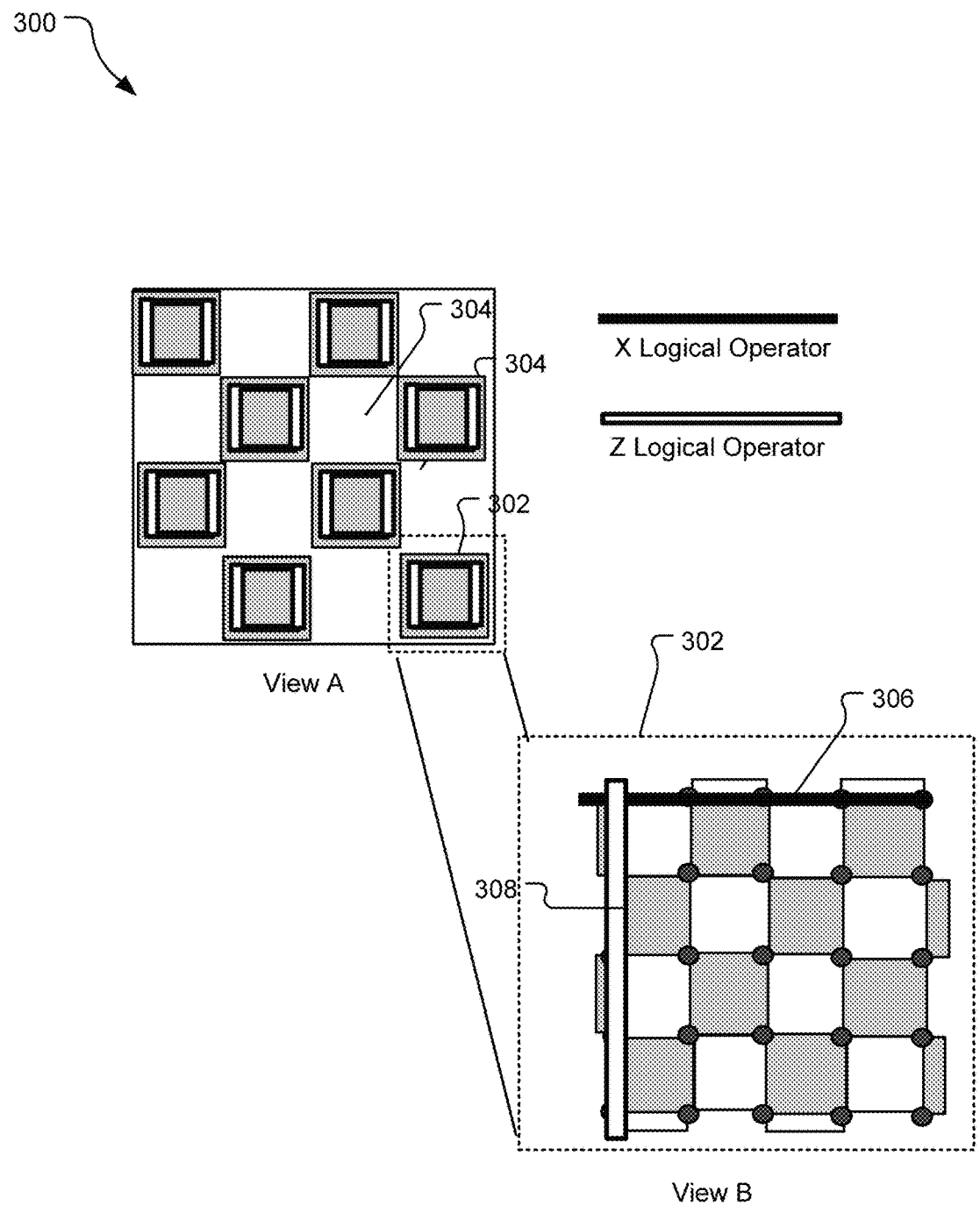
FIG. 3 illustrates a proposed surface code architecture in which the qubit grid of a measurement circuit is partitioned into a checkerboard pattern of logical qubit patches and ancilla qubit patches.

F. Proposed Surface Code Architecture to Support $\overline{ZX}$ and $\overline{XZ}$ Measurements to Replace Hadamard Operations FIG. 3 illustrates a proposed surface code architecture 300 in which the qubit grid of a measurement circuit includes a checkerboard pattern of logical qubit patches and ancilla qubit patches. View A of FIG. 3 illustrates this concept using a checkerboard grid of logical qubit patches (e.g., a logical qubit patch 302) with empty space between horizontally-adjacent and vertically-adjacent pairs of logical qubit patches. Each of these empty spaces is intended to represent an "ancilla patch" (e.g., an ancilla patch 304). The logical qubit patches store data, while the ancilla qubit patches are used to facilitate logical Pauli operations involving multiple logical qubit patches). In one implementation, the ancilla patches have characteristics identical to the data qubit patches (e.g., equal circuit depth and identical architecture).

The logical qubit patch 302 is shown in greater detail in View B. Although the logical qubit patch 302 may be of any depth, logical qubit patch 302 is, by example and without limitation, a depth (d) of five. The logical qubit patch 302 may include characteristics the same or similar to the surface code patches described above with respect to FIG. 1. In other implementations, the logical qubit patches are of different depths. Within each logical qubit patch, the product of Z-basis measurements along any qubit column (e.g., a column 306) is a logical operator Z of the patch, while the product of X-basis measurements along any row of qubits (e.g., a row 308) is a logical operator $\overline{X}$ of the patch.

Exemplary utility of the ancilla qubit patches (e.g., ancilla patch 304) is discussed in more detail below with respect to FIG. 4A-4D.

Figure 4A:
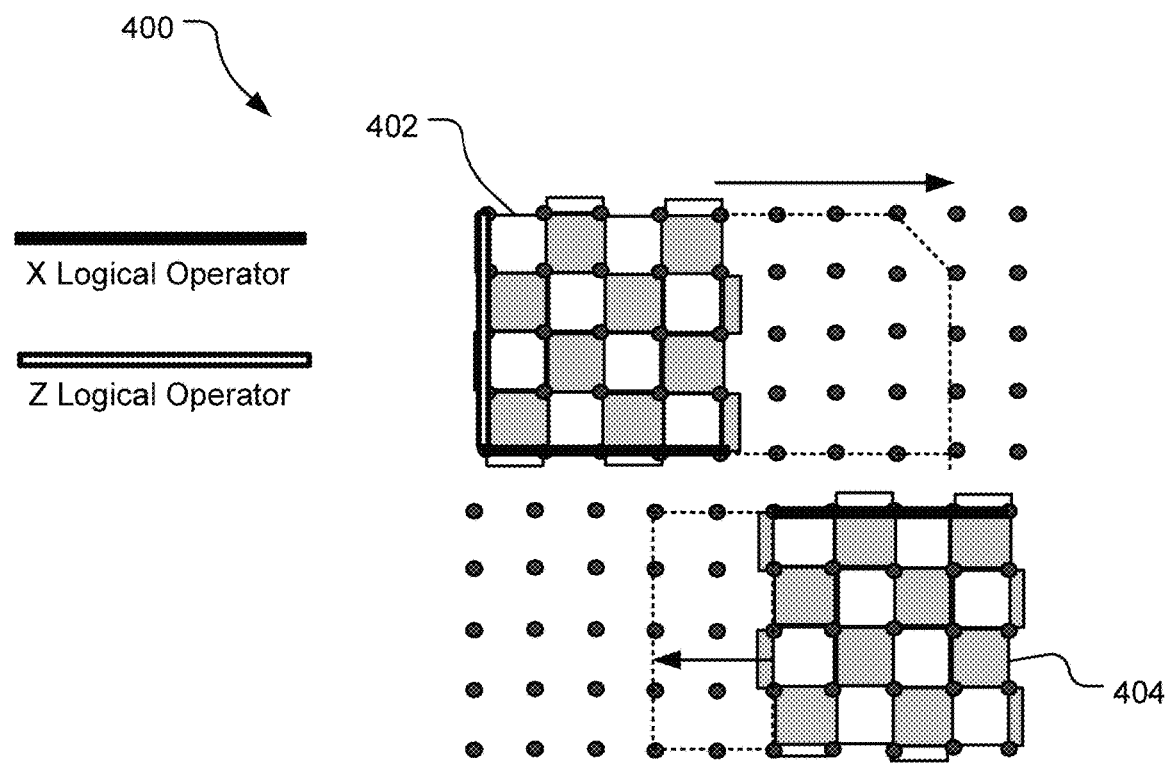
FIG. 4A illustrates a first stage of exemplary operations for performing a joint measurement on diagonally-adjacent logical patches of surface code.
Figure 4B:
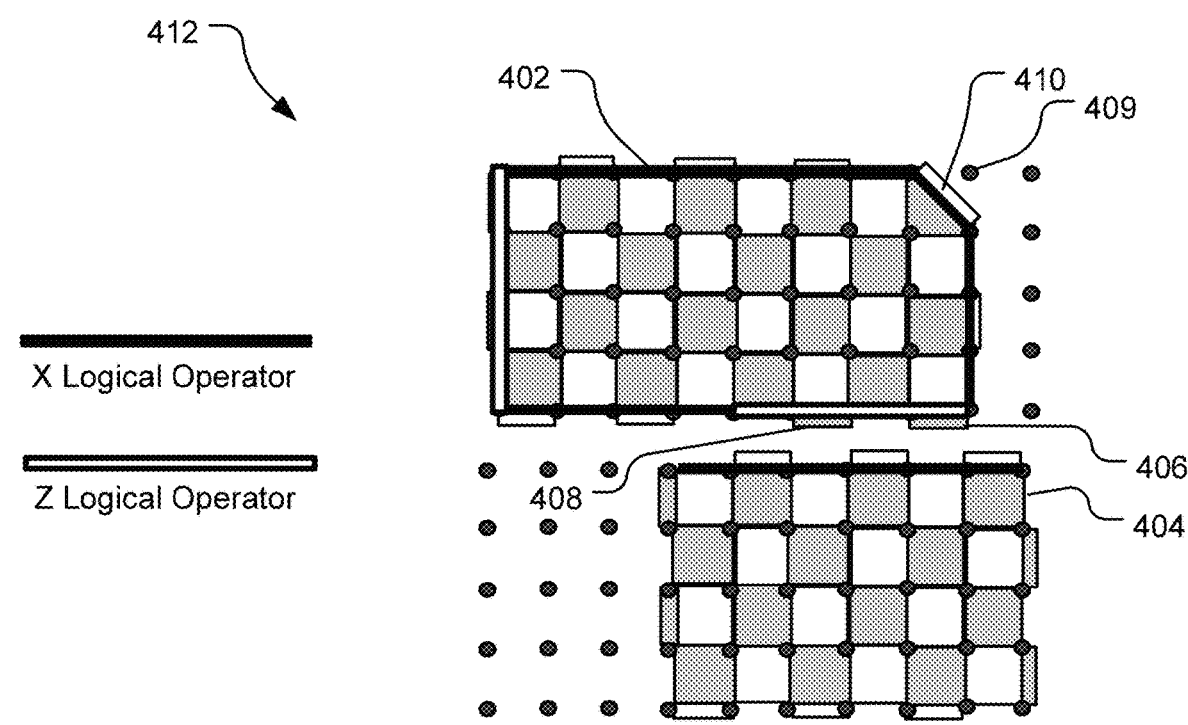
FIG. 4B illustrates another stage of exemplary operations for performing a joint measurement to be performed following the operations described above with respect to FIG. 4A.
Figure 4C:
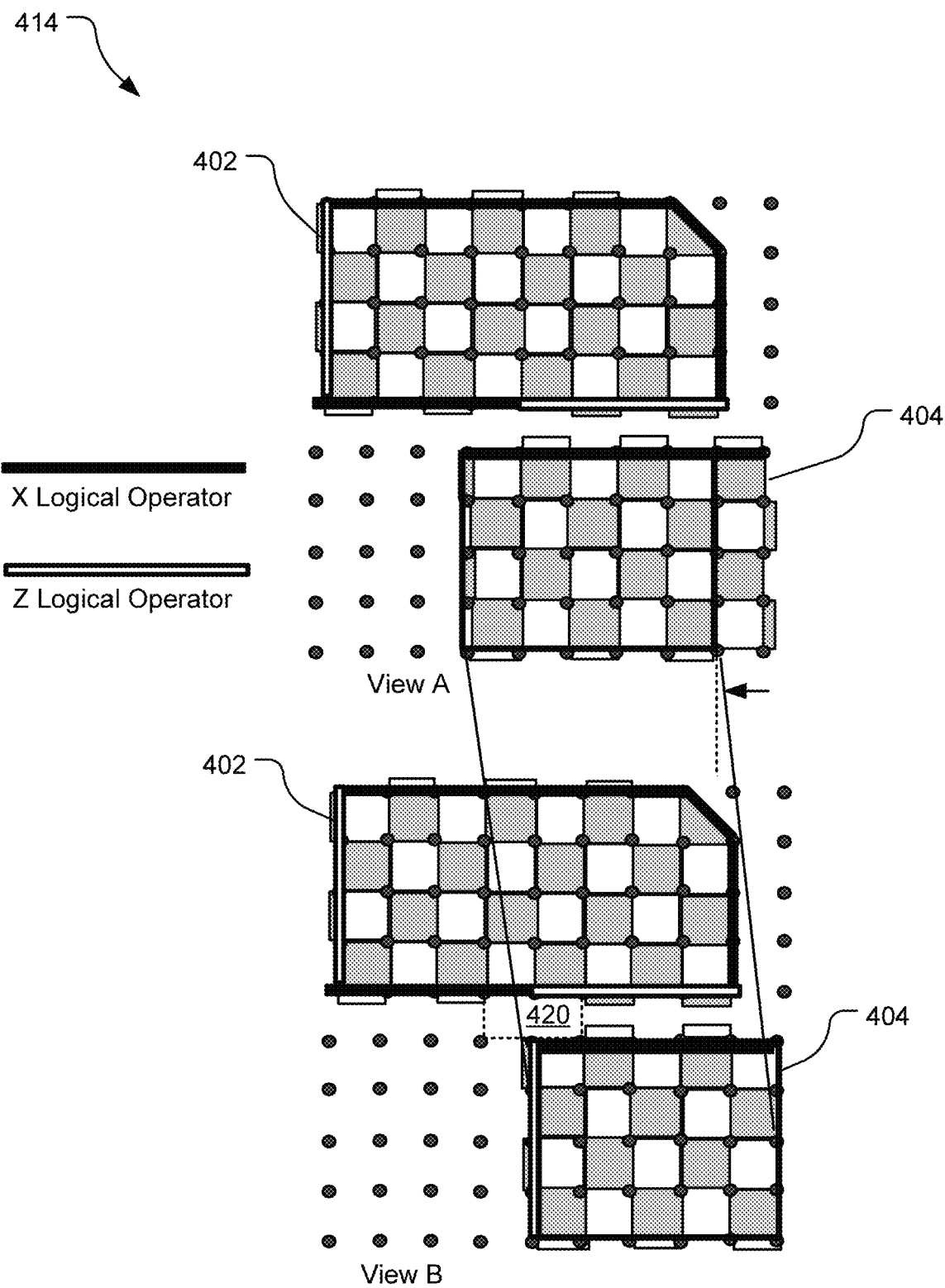
FIG. 4C illustrates another stage of exemplary operations for performing a joint measurement that is to be performed following the operations described above with respect to FIG. 4A-4B.

FIG. 4A-4D illustrate example operations for performing a $\overline{ZX}$ measurement on two diagonally-arranged (e.g., diagonally-adjacent) logical qubit patches of surface code. As mentioned above, a necessary ingredient for replacing the Hadamard gate with Hadamard-conjugate Pauli equivalents is a mechanism for measuring $\overline{ZX}$ across two logical patches of surface code. In FIGS. 4A-4C, this is achieved by performing various shifting and teleportation operations to align a Z-logical operator of a first patch to an X-logical operator of another patch, allowing stabilizer measurements at the boundary between the two operators.

FIG. 4A illustrates a first stage of exemplary operations 400 for measuring $\overline{ZX}$ across two logical patches of surface code. Here, a first logical patch 402 is expanded to the right and a second logical patch 404 is expanded to the left.

The expansion of the first logical patch 402 increases the size of this patch to include four additional columns. This is possible with two layers of teleportation or swaps using the ancilla qubits that sit at the center of the plaquettes. For example, each data qubit is first teleported to the immediate lower right ancilla qubit and then again teleported from the ancilla qubit to the immediate upper right data qubit. If one-qubit and two-qubit measurements are native operations in the quantum hardware, then these two layers of teleportation are implemented by a total of five rounds of measurements. Notably, this teleportation is performed so as to exclude a data qubit from the top right corner of the patch. As used herein, "excluding a qubit from a patch" is intended to imply that the excluded qubit (1) does not store data of the logical qubit encoded by the patch and (2) is not entangled with any other qubits of the patch.

The reasons that the data qubit is excluded from the top right corner of the first logical patch 402 are evident from the remaining operations in the $\overline{ZX}$ measurement, described below. Using similar teleportation techniques or swaps as those described above, the second logical patch 404 is expanded to the left by two columns.

FIG. 4B illustrates another stage 412 of exemplary operations for measuring $\overline{ZX}$ across two logical patches of surface code to be performed immediately following the operations described above with respect to FIG. 4A. Following the expansion of the first logical patch 402 to the right by the four columns shown in FIG. 4A, stabilizers are measured on each plaquette. Measurement of the stabilizers may be achieved in two measurement rounds—e.g., a first round in which all X-type stabilizers are computed followed by a second round in which all Z-type stabilizers are computed. The same is done for the second logical patch 404.

The computation of stabilizers is generally consistent with traditional methods except with respect to the choice of certain weight-2 stabilizers that are computed at a boundary between the two patches (e.g., boundary stabilizers 406, 408) and of a weight-2 stabilizer that is computed at an upper-right corner of the first logical patch 402 (a corner stabilizer 410). Since the boundary stabilizers 406 and 408 are measured in the Z-basis, a logical Z operator of the first logical patch 402 aligns with a logical X operator of the second logical patch 404. Moreover, since the top right corner of the patch is deformed to exclude a data qubit 409, the illustrated choice of stabilizers allows the logical X operator to wrap around the right side of the first logical patch 402, as shown.

FIG. 4C illustrates a later stage 414 of exemplary operations for measuring ZX across two logical patches of surface code to be performed immediately following the operations described above with respect to FIG. 4B. After the first logical patch 402 and the second logical patch 404 are shifted and stabilizers measured as described above, the second logical patch 404 (on the bottom) is shrunk by one column on the right side and is moved to the left by one column, as shown in View A (prior to shrinking and moving the second logical patch 404) and View B (after shrinking and moving the second logical patch 404).

The transformation of the second logical patch 404 from the size and position of View A to View B can, as above, be achieved via swap or teleportation operations that move each data qubit to the immediate lower right ancilla qubit and then back up to the immediate upper right data qubit. This move effectively overwrites previous states of data stored in the right-most column. Notably, after the shift illustrated in View B, there are no boundary stabilizers in a center region 420 including the two center-most columns.

Figure 4D:
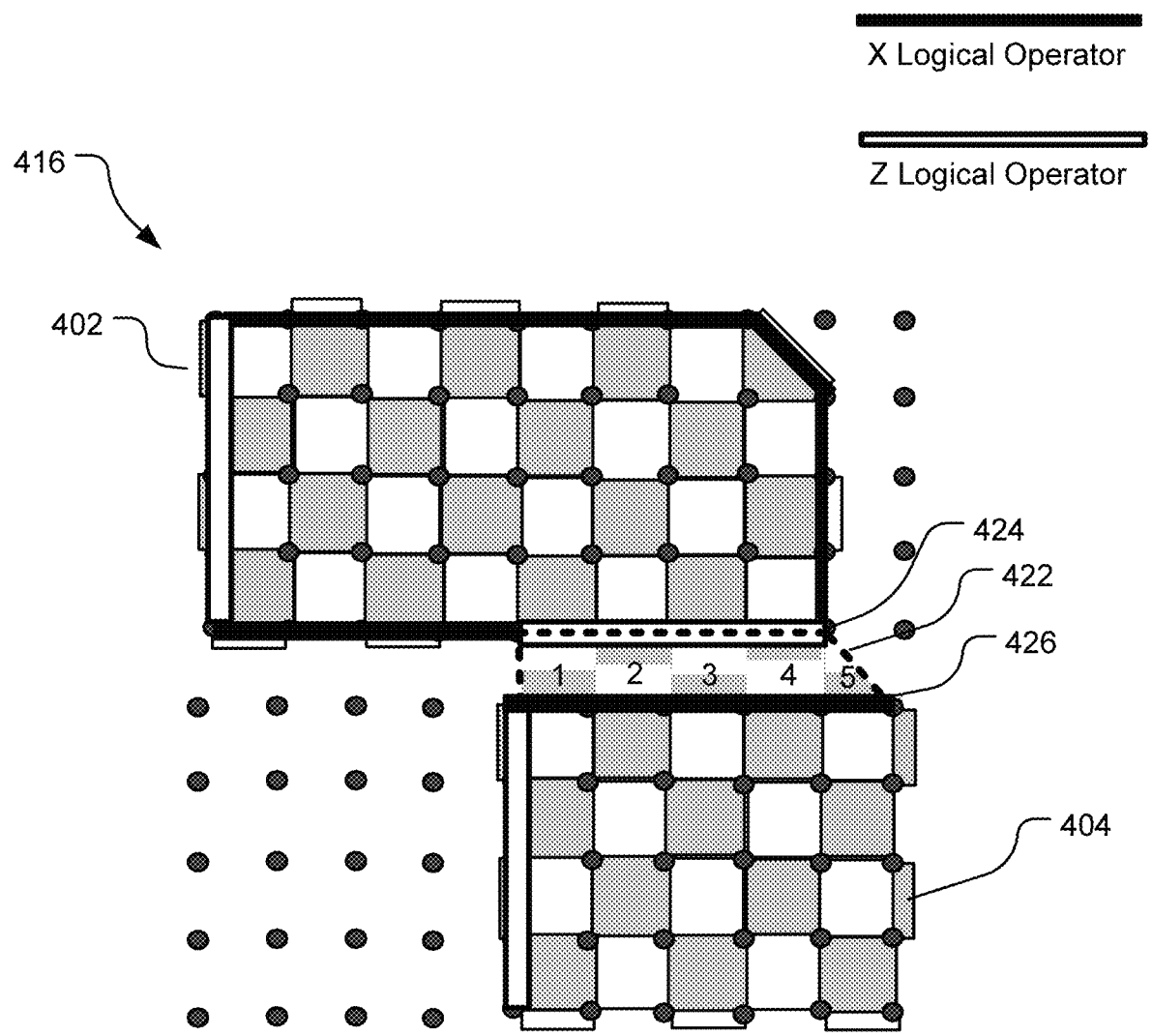
FIG. 4D illustrates yet another stage of exemplary operations for performing a joint measurement that is to be performed following the operations described above with respect to FIG. 4A-4C.

FIG. 4D illustrates another stage 416 of exemplary operations for measuring $\overline{ZX}$ across two logical patches of surface code immediately following the operations described above with respect to FIG. 4C. In this stage, the first logical patch 402 is merged with the second logical patch 404 by measuring an additional row of stabilizers at the boundary between a logical X operator 424 of the first logical patch 402 and the logical Z operator 426 of the lower patch 404 (e.g., within the region 422). Of the stabilizers in the region 422, the left-most four (labeled '1', '2', '3', '4' in FIG. 4D) are weight-4 stabilizers and the right-most stabilizer (labeled '5') is a weight-3 stabilizer. Of these five stabilizers measured, three are used to infer the requested logical measurement outcome and the remaining two are used to correct errors.

To compute the logical $\overline{ZX}$ of the first logical patch 402 and the second logical patch 404, the logical values (stabilizers) are read from the first, third, and fifth plaquettes in the region 418 (stabilizers 1, 3, and 5). The product of these three values is the logical $\overline{ZX}$ of the two surface code patches.

After the measurement depicted in FIG. 4D, the two patches are split (e.g., by re-initializing the ancilla qubits in the region 418 to a known value), and the second logical patch 404 is moved one column to the right (using appropriate swap/teleportation operations) to restore its original state shown and described with respect to FIG. 4A. Notably, a logical $\overline{XZ}$ measurement of the two surface code patches can be similarly performed by way of operations similar to those described with respect to FIG. 4A executed with respect to the diagonal from top left to bottom right.

Figure 5:
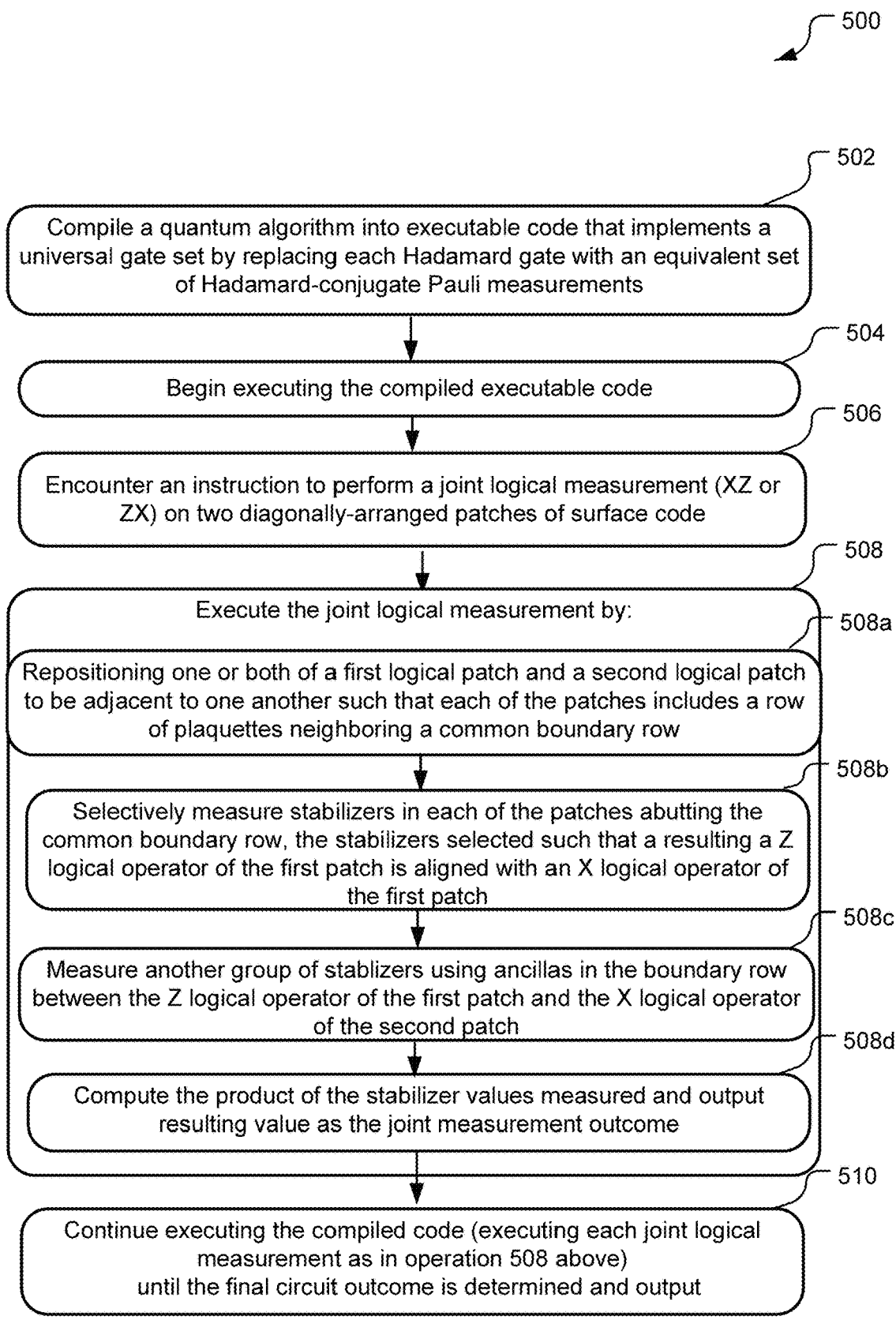
FIG. 5 illustrates example operations 500 for implementing Hadamard-conjugated Pauli measurements that equivalently replace Hadamard operations and act on logical qubits within a quantum circuit implementing a surface code architecture.

FIG. 5 illustrates example operations 500 for implementing Hadamard-conjugated Pauli measurements that equivalently replace Hadamard operations and act on logical qubits within a quantum circuit implementing a surface code architecture.

A first compilation operation 502 compiles a high-level quantum operation into a set of instructions executable by a quantum computer to perform measurements of quantum states. According to one implementation, the high-level quantum algorithm relies on a universal gate set, such as Clifford+T (e.g., CNOT, S, and H operations). During compilation, the algorithm is translated into a set of instructions for controlling quantum hardware to implement a sequence of Pauli measurements including at least one $\overline{XZ}$ or $\overline{Z}\overline{X}$ measurement. This set of instructions effectively replaces each Hadamard (H) operation in the algorithm with a modified measurement (e.g., an XZ or ZX logical measurement) that lacks a Hadamard gate. Stated differently, the compilation of the high-level algorithm removes every Hadamard gate in the algorithm by commuting the Hadamard gate through the circuit and by modifying Pauli measurements with Hadamard-conjugated Pauli measurements. These quantum hardware control instructions are accompanied by classically-executable instructions for computing an outcome of a Hadamard operation on a logical qubit using the Pauli measurement(s).

At an execution operation 504, a classical processor begins executing the compiled executable code by sending control signals to manipulate qubits in a quantum circuit. During execution of the compiled executable code, a joint measurement instruction 506 is encountered. This joint measurement operation is, for example, an XZ or ZX measurement that implements a Hadamard-conjugated Pauli measurement. The classical processor controls the quantum circuit to execute the Hadamard-conjugated Pauli measurement by way of a joint measurement performed on two diagonally-arranged patches of surface code, where the surface code is of distance d.

The joint measurement instruction is executed via commencement of a joint measurement operation 508, which includes several sub-operations referred to below as 508a, 508c, 508c, and 508d. First, a repositioning operation 508a repositions two diagonally-arranged first and second logical patches of surface code by expanding and/or shifting the patches using swap and/or teleportation operations such that the two logical patches are each manipulated to include a row of plaquettes neighboring a common boundary row (e.g., a row of ancillas of depth d equal to the depth of the surface code) that is not included in either of the two patches.

A boundary stabilizer measurement operation 508b selectively measures weight-2 stabilizers in the first logical patch and also in the second logical patch at locations neighboring the boundary row. The weight-2 stabilizers selected for measurement are positioned so as to ensure that, following the boundary stabilizer measurement operation 508b and the repositioning operation 508a, a Z logical operator of a first logical patch is aligned with an X logical operator of a second logical patch (e.g., as shown in FIG. 4D). Notably, the repositioning operation 508a may include multiple different repositioning steps, some of which are performed before and others which are performed after the stabilizer measurement 508b.

After the first logical patch and the second logical patch are positioned adjacent to the boundary row with the Z and X logical operators aligned, another stabilizer measurement operation 508c measures a group of stabilizers using the ancillas included in the boundary row between the Z logical operator of the first logical patch and the X logical operator of the second logical patch (e.g., as described with respect to FIG. 4D).

A computation operation 508 computes a product of the measured stabilizer values and outputs the result as the joint measurement outcome. As indicated by execution operation(s) 510, the circuit proceeds to execute the remainder of the compiled code, executing each joint logical measurement as described above with respect to operation 508, until the final circuit outcome is determined and output.

Figure 6:
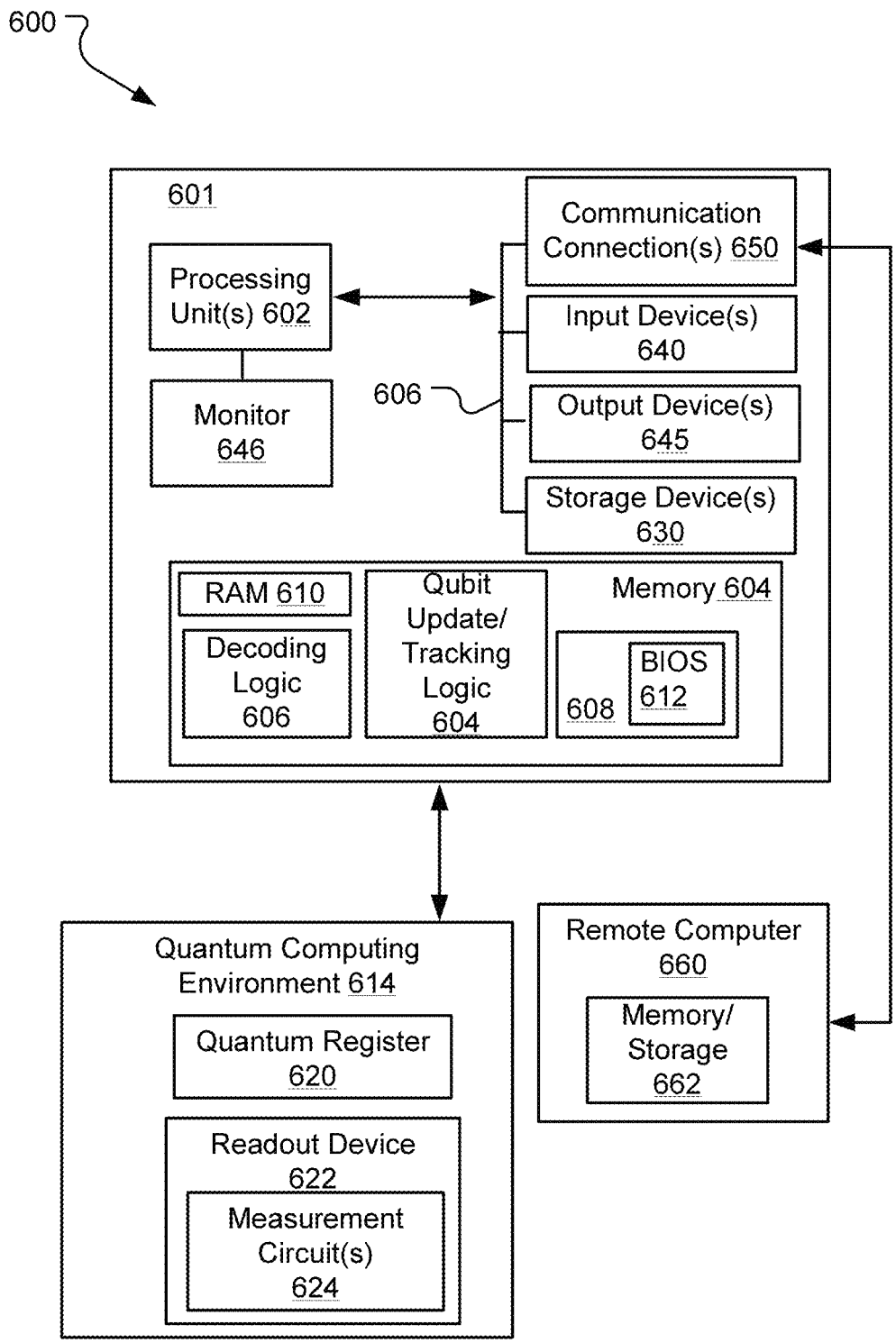
FIG. 6 illustrates an exemplary computing environment suitable for implementing aspects of the disclosed technology.

FIG. 6 illustrates an exemplary computing environment 600 suitable for implementing aspects of the disclosed technology. This figure and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

The computing environment 600 of FIG. 6 includes a quantum computing environment 614 coupled to a classical computing environment, shown to include a PC 601. The quantum computing environment includes at least a quantum register 620 and a readout device 622 including quantum hardware implementing measurement circuits 624. Aspects of the quantum computing environment 614 may be controlled by hardware and software elements of the PC 601.

In one implementation, the PC 601 includes one or more processing units 602, a system memory 604, and a system bus 606 that couples various system components including the system memory 604 to the one or more processing units 602. The system bus 606 may be any of several types of bus structures including a memory bus or memory controller, a peripheral bus, and a local bus using any of a variety of bus architectures. The exemplary system memory 604 includes read only memory (ROM) 608 and random access memory (RAM) 610. A basic input/output system (BIOS) 612, containing the basic routines that help with the transfer of information between elements within the PC 601, is stored in ROM 608.

In one implementation, the system memory 604 stores qubit update and tracking logic 604 (e.g., for classically updating and tracking logical qubit values based on data received from the readout device 622), and also stores decoding logic 611 for detecting and correcting errors in measurement data.

The PC 601 further includes one or more storage devices 630 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 606 by a hard disk drive interface, a magnetic disk drive interface, and an optical drive interface, respectively. The drives and their associated computer readable media provide nonvolatile storage of computer-readable instructions, data structures, program modules, and other data for the PC 601. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 630 including an operating system, one or more application programs, other program modules, and program data. A user may enter commands and information into the PC 601 through one or more input devices 640 such as a keyboard and a pointing device such as a mouse. Other input devices may include a digital camera, microphone, joystick, game pad, satellite dish, scanner, or the like. These and other input devices are often connected to the one or more processing units 602 through a serial port interface that is coupled to the system bus 606, but may be connected by other interfaces such as a parallel port, game port, or universal serial bus (USB). A monitor 646 or other type of display device is also connected to the system bus 606 via an interface, such as a video adapter. Other peripheral output devices 645, such as speakers and printers (not shown), may be included.

The PC 601 may operate in a networked environment using logical connections to one or more remote computers, such as a remote computer 660. In some examples, one or more network or communication connections 750 are included. The remote computer 660 may be another PC, a server, a router, a network PC, or a peer device or other common network node, and typically includes many or all of the elements described above, although only a memory storage device 662 has been illustrated in FIG. 6. The PC 601 and/or the remote computer 660 can be connected to a logical a local area network (LAN) and a wide area network (WAN). Such networking environments are commonplace in offices, enterprise wide computer networks, intranets, and the Internet.

When used in a LAN networking environment, the PC 601 is connected to the LAN through a network interface. When used in a WAN networking environment, the PC 601 typically includes a modem or other means for establishing communications over the WAN, such as the Internet. In a networked environment, program modules depicted relative to the PC 601, or portions thereof, may be stored in the remote memory storage device or other locations on the LAN or WAN. The network connections shown are exemplary, and other means of establishing a communications link between the computers may be used.

The PC 601 may include a variety of tangible computer-readable storage media and intangible computer-readable communication signals. Tangible computer-readable storage can be embodied by any available media that can be accessed by the processing device 601 and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information, and which can be accessed by the processing device 600. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendix, provide a complete description of the structure and use of exemplary implementations.

An example method disclosed herein provides for translating a circuit with at least one Hadamard gate into an equivalent circuit that lacks a Hadamard gate and implementing the equivalent circuit by performing a set of measurements that includes a joint logical measurement on two diagonally-arranged patches of surface code implemented in a quantum measurement circuit.

In another example method of any preceding method, the joint logical measurement is a logical $\overline{ZX}$ or a logical $\overline{XZ}$ measurement.

In still another example method of any preceding method, the surface code implemented in the quantum measurement circuit includes a checkboard pattern of logical patches intermixed with ancilla patches.

In yet still another example method of any preceding method, the two diagonally-arranged patches of surface code are logical patches, and performing the joint logical measurement further comprises expanding a first logical patch of the diagonally-arranged logical patches in a first direction to include a portion of an adjacent ancilla patch that is aligned in a second direction with a second logical patch of the diagonally-arranged logical patches, where the first direction is perpendicular to the second direction. The method further provides for shifting a position of the second logical patch toward the first logical patch.

In yet another example method of any preceding method, performing the joint logical measurement further comprises measuring a first subset of stabilizers of the first logical patch at a boundary of the first logical patch in a region aligned in the second direction with the second logical patch; and measuring a second subset of stabilizers of the second logical patch at a boundary of the second logical patch in a region aligned in the second direction with the first logical patch. In these operations, the first subset and the second subset of stabilizers are selected to ensure that a Z logical operator of the first logical patch is aligned with an X logical operator of the second logical patch.

In still another example method of any preceding method, performing the joint logical measurement further comprises measuring stabilizers in a boundary row between Z logical operator of the first logical patch and the X logical operator of the second logical patch and computing a product of the stabilizer measurements. In yet another example method of any preceding method, the method further comprises excluding a qubit from a corner plaquette of the first logical patch while expanding the first logical patch.

In still another example method of any preceding method, the method further comprises selecting the first subset of stabilizers of the first logical patch and the second subset of stabilizers of the second logical patch such that there exist two adjacent plaquettes abutting the boundary row for which no stabilizers are measured.

In another example method of any preceding method, the method further comprises implementing a complete set of Clifford operations exclusively using Pauli measurements in a measurement circuit employing surface code.

An example quantum system disclosed herein includes a classical controller and a quantum measurement circuit. The classical controller is configured to translate a Hadamard operation within a quantum algorithm into executable instructions for performing one or more Pauli measurements that include a joint logical measurement on two diagonally-arranged patches of surface code. The quantum measurement circuit that implements the surface code is controlled by the classical controller to perform the joint logical measurement on the two diagonally-arranged patches of surface code.

In an example quantum system of any preceding system, the joint logical measurement is a logical $\overline{ZX}$ or a logical $\overline{X Z}$ measurement.

In still another example quantum system of any preceding system, the surface code implemented in the quantum measurement circuit includes a checkboard pattern of logical patches intermixed with ancilla patches.

In yet another example quantum system of any preceding system, the two diagonally-arranged patches of surface code are logical patches and the quantum measurement circuit performs the joint logical measurement further comprises: expanding a first logical patch of the diagonally-arranged logical patches in a first direction to include a portion of an adjacent ancilla patch that is aligned in a second direction with a second logical patch of the diagonally-arranged logical patches, the first direction being perpendicular to the second direction; and shifting a position of the second logical patch toward the first logical patch.

In yet still another example quantum system of any preceding system, performing the joint logical measurement further comprises measuring a first subset of stabilizers of the first logical patch at a boundary of the first logical patch in a region aligned in the second direction with the second logical patch; and measuring a second subset of stabilizers of the second logical patch at a boundary of the second logical patch in a region aligned in the second direction with the first logical patch. The first subset and the second subset of stabilizers are selected to ensure that a Z logical operator of the first logical patch is aligned with an X logical operator of the second logical patch.

In still yet another example quantum system of any preceding system, performing the joint logical measurement further comprises measuring stabilizers in a boundary row between a Z logical operator of the first logical patch and an X logical operator of the second logical patch and computing a product of the stabilizer measurements.

In still yet another example quantum system of any preceding system, expanding the first logical patch further comprises excluding a qubit from corner plaquette of the first logical patch while expanding the first logical patch.

In another quantum system of any preceding system, performing the joint logical measurement further comprises selecting the first subset of stabilizers of the first logical patch and the second subset of stabilizers of the second logical patch such that there exist two adjacent plaquettes at the boundary row for which no stabilizers are measured.

An example computer readable storage media disclosed herein encodes computer-executable instructions for executing a computer process. The computer process comprises translating a circuit with at least one Hadamard gate into an equivalent circuit that lacks a Hadamard gate and implementing the equivalent circuit by instructing a quantum measurement circuit to perform a set of measurements that includes a joint logical measurement on two diagonally-arranged patches of surface code implemented in a quantum measurement circuit. The joint logical measurement is either a logical $\overline{ZX}$ measurement or a logical $\overline{XZ}$ measurement.

In another example computer process of any proceeding computer process, the computer process further comprises instructing the quantum measurement circuit to perform the measurements using a surface code, and the quantum measurement circuit includes a checkboard pattern of logical patches intermixed with ancilla patches.

In still yet another example computer process of any proceeding computer process, the joint logical measurement is implemented via a series of operations that include expanding a first logical patch of the diagonally-arranged logical patches in a first direction to include a portion of an adjacent ancilla patch that is aligned in a second direction with a second logical patch of the diagonally-arranged logical patches, the first direction being perpendicular to the second direction; shifting the second logical patch toward an original position of the first logical patch; measuring one or more stabilizers in a boundary row between the first logical patch and the second logical patch; and computing a product of the measured stabilizers.

An example system disclosed herein includes a means for translating a circuit with at least one Hadamard gate into an equivalent circuit that lacks a Hadamard gate, and a means for implementing the equivalent circuit by performing a set of measurements that includes a joint logical measurement on two diagonally-arranged patches of surface code implemented in a quantum measurement circuit.

The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims. The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims.

What is claimed is:

1. A method comprising:
    translating a circuit with at least one Hadamard gate into an equivalent circuit that lacks a Hadamard gate; and
    implementing the equivalent circuit by performing a set of measurements that includes a joint logical measurement on two diagonally-arranged logical patches of surface code implemented in a quantum measurement circuit, the joint logical measurement including a sequence of operations comprising:
    expanding a first logical patch of the diagonally-arranged logical patches in a first direction to include a portion of an adjacent ancilla patch that is aligned in a second direction with a second logical patch of the diagonally-arranged logical patches, the first direction being perpendicular to the second direction; and
    shifting a position of the second logical patch toward the first logical patch.

2. The method of claim 1, wherein the joint logical measurement is a logical $\overline{ZX}$ or a logical $\overline{XZ}$ measurement.

3. The method of claim 1, wherein the surface code implemented in the quantum measurement circuit includes a checkboard pattern of logical patches intermixed with ancilla patches.

4. The method of claim 1, wherein performing the joint logical measurement further comprises:
    measuring a first subset of stabilizers of the first logical patch at a boundary of the first logical patch in a region aligned in the second direction with the second logical patch;
    measuring a second subset of stabilizers of the second logical patch at a boundary of the second logical patch in a region aligned in the second direction with the first logical patch, the first subset and the second subset of stabilizers being selected to ensure that a Z logical operator of the first logical patch is aligned with an X logical operator of the second logical patch.

5. The method of claim 4, wherein performing the joint logical measurement further comprises:
    measuring stabilizers in a boundary row between Z logical operator of the first logical patch and the X logical operator of the second logical patch; and
    computing a product of the stabilizer measurements.

6. The method of claim 1, further comprising:
    excluding a qubit from a corner plaquette of the first logical patch while expanding the first logical patch.

7. The method of claim 5, further comprising:
    selecting the first subset of stabilizers of the first logical patch and the second subset of stabilizers of the second logical patch such that there exist two adjacent plaquettes abutting the boundary row for which no stabilizers are measured.

8. The method of claim 1, further comprising:
    implementing a complete set of Clifford operations exclusively using Pauli measurements in a measurement circuit employing surface code.

9. A quantum system comprising:
a classical controller configured to translate a Hadamard operation within a quantum algorithm into executable instructions for performing one or more Pauli measurements, the one or more Pauli measurements including a joint logical measurement on two diagonally-arranged logical patches of surface code; and
a quantum measurement circuit that implements the surface code and that is controlled by the classical controller to perform the joint logical measurement on the two diagonally-arranged logical patches of surface code, the performance of the joint logical measurement including:
expanding a first logical patch of the diagonally-arranged logical patches in a first direction to include a portion of an adjacent ancilla patch that is aligned in a second direction with a second logical patch of the diagonally-arranged logical patches, the first direction being perpendicular to the second direction; and
shifting a position of the second logical patch toward the first logical patch.

10. The quantum system of claim 9, wherein the joint logical measurement is a logical $\overline{ZX}$ or a logical $\overline{XZ}$ measurement.

11. The quantum system of claim 9, wherein the surface code implemented in the quantum measurement circuit includes a checkboard pattern of logical patches intermixed with ancilla patches.

12. The quantum system of claim 9, wherein the quantum measurement circuit performs the joint logical measurement by:
measuring a first subset of stabilizers of the first logical patch at a boundary of the first logical patch in a region aligned in the second direction with the second logical patch;
measuring a second subset of stabilizers of the second logical patch at a boundary of the second logical patch in a region aligned in the second direction with the first logical patch, the first subset and the second subset of stabilizers being selected to ensure that a Z logical operator of the first logical patch is aligned with an X logical operator of the second logical patch.

13. The quantum system of claim 9, wherein the quantum measurement circuit performs the joint logical measurement by:
measuring stabilizers in a boundary row between a Z logical operator of the first logical patch and an X logical operator of the second logical patch; and
computing a product of the stabilizer measurements.

14. The quantum system of claim 13, wherein the quantum measurement circuit performs the joint logical measurement by:
selecting the first subset of stabilizers of the first logical patch and the second subset of stabilizers of the second logical patch such that there exist two adjacent plaquettes at the boundary row for which no stabilizers are measured.

15. The quantum system of claim 9, wherein expanding the first logical patch further comprises:
excluding a qubit from corner plaquette of the first logical patch while expanding the first logical patch.

16. One or more computer-readable storage media encoding computer executable instructions for executing a computer process comprising:
translating a circuit with at least one Hadamard gate into an equivalent circuit that lacks a Hadamard gate; and
implementing the equivalent circuit by performing a set of measurements that includes a joint logical measurement on two diagonally-arranged logical patches of surface code implemented in a quantum measurement circuit, the joint logical measurement being either a logical $\overline{ZX}$ measurement or a logical $\overline{XZ}$ measurement and being implemented by operations including:
expanding a first logical patch of the diagonally-arranged logical patches in a first direction to include a portion of an adjacent ancilla patch that is aligned in a second direction with a second logical patch of the diagonally-arranged logical patches, the first direction being perpendicular to the second direction;
shifting the second logical patch toward an original position of the first logical patch;
measuring one or more stabilizers in a boundary row between the first logical patch and the second logical patch; and
computing a product of the measured stabilizers.

17. The one or more computer-readable storage media of claim 16, wherein the surface code implemented in the quantum measurement circuit includes a checkboard pattern of logical patches intermixed with ancilla patches.

* * * * *